(12) United States Patent
Chang

(10) Patent No.: US 8,482,918 B2
(45) Date of Patent: Jul. 9, 2013

(54) SERVER SYSTEM WITH HEAT DISSIPATING DEVICE

(75) Inventor: Yao-Ting Chang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 337 days.

(21) Appl. No.: 12/972,491

(22) Filed: Dec. 19, 2010

(65) Prior Publication Data
US 2012/0063083 A1 Mar. 15, 2012

(51) Int. Cl.
*H05K 7/20* (2006.01)
*H05K 5/00* (2006.01)
*F25D 17/06* (2006.01)

(52) U.S. Cl.
USPC ........... 361/695; 361/693; 361/727; 454/184; 454/306; 62/419; 62/426

(58) Field of Classification Search
USPC ................. 361/695, 692–693, 679.48–679.5, 361/724–727; 454/184
See application file for complete search history.

(56) References Cited

U.S. PATENT DOCUMENTS

| | | | |
|---|---|---|---|
| 6,616,524 B2* | 9/2003 | Storck et al. | 454/184 |
| 7,319,594 B2* | 1/2008 | Nicolai et al. | 361/724 |
| 7,508,663 B2* | 3/2009 | Coglitore | 361/695 |
| 7,751,188 B1* | 7/2010 | French et al. | 361/691 |
| 7,857,688 B1* | 12/2010 | Cunningham et al. | 454/184 |
| 8,077,455 B2* | 12/2011 | Jian | 361/679.48 |
| 2008/0291625 A1* | 11/2008 | Rathbun et al. | 361/695 |
| 2009/0046427 A1* | 2/2009 | Noteboom et al. | 361/695 |

* cited by examiner

Primary Examiner — Zachary M Pape
(74) Attorney, Agent, or Firm — Altis Law Group, Inc.

(57) ABSTRACT

An exemplary server system includes a server cabinet, two rows of racks arranged in the server cabinet, a number of servers mounted in the racks and a heat dissipating device. The server cabinet includes two side plates parallel to each other. The servers of each row are evenly distributed between the side plates. A channel is defined between the two rows of racks. The heat dissipating device includes an air conditioner arranged over the racks for generating cooling air and an air guiding mechanism. The air conditioner defines a number of apertures facing the passage. The guiding mechanism includes a number of tubes received in the passage and respectively coupled to the apertures of the air conditioner. Each of the tubes defines a number of air outlets for exhausting the cooling air towards the servers.

18 Claims, 3 Drawing Sheets

SERVER SYSTEM WITH HEAT DISSIPATING DEVICE

CROSS REFERENCE TO RELATED APPLICATION

This application is related to two co-pending applications respectively entitled "SERVER SYSTEM WITH HEAT DISSIPATION DEVICE" (Ser. No. 12/972,495) and "SERVER SYSTEM WITH HEAT DISSIPATION APPARATUS" (Ser. No. 12/972,509), assigned to the same assignee of this application and filed on the same date as this application. The two related applications are incorporated herein by reference.

BACKGROUND

1. Technical Field

The present disclosure relates to heat dissipation from electronic apparatuses, and more particularly to a server system utilizing a heat dissipating device.

2. Description of Related Art

A server system often includes a number of standard servers stacked in a standard server cabinet. Each of the servers typically includes at least a power supply device, a motherboard, a hard disk drive, and an optical disk drive, all of which can generate considerable heat during operation. The servers may suffer damage if the heat is not efficiently removed.

What is needed, therefore, is a solution which can overcome the limitations described.

DETAILED DESCRIPTION

Figure 1:
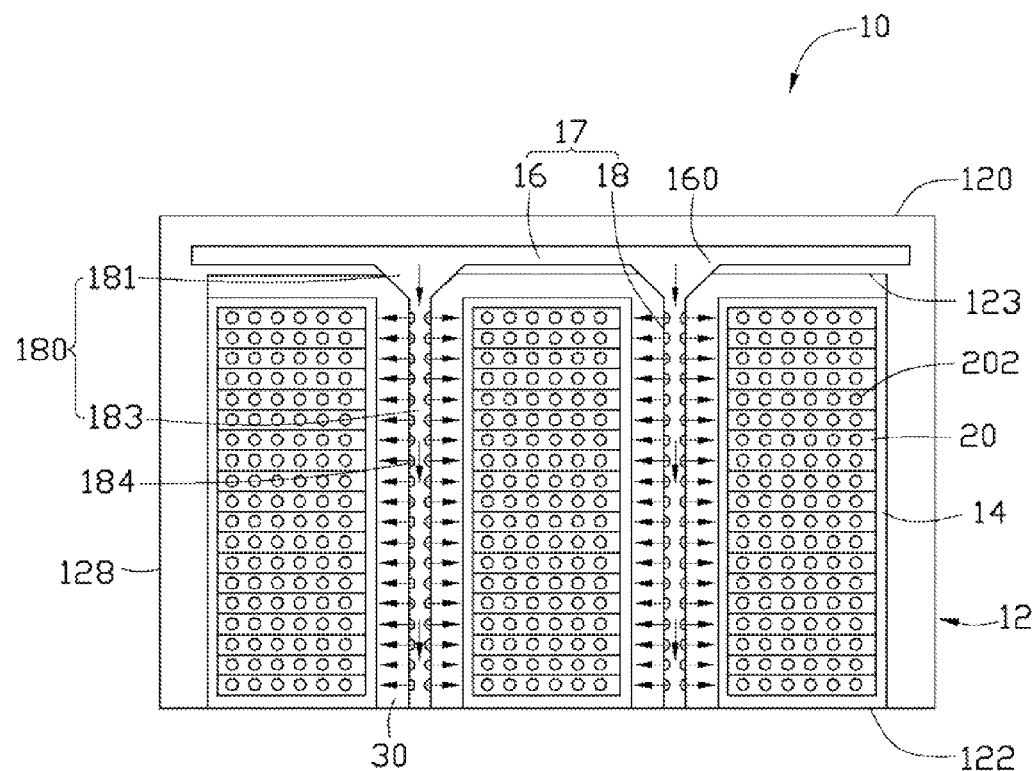
FIG. 1 is a schematic, front view of a server system in accordance with an embodiment of the disclosure, wherein a front end plate of a server cabinet of the server system is omitted.

Referring to FIG. 1, a server system 10 in accordance with an exemplary embodiment is shown. The server system 10 includes a server cabinet 12, a number of racks 14 accommodated in the server cabinet 12, a number of servers 20 mounted in the racks 14, and a heat dissipating device 17 for cooling the servers 20.

Figure 2:
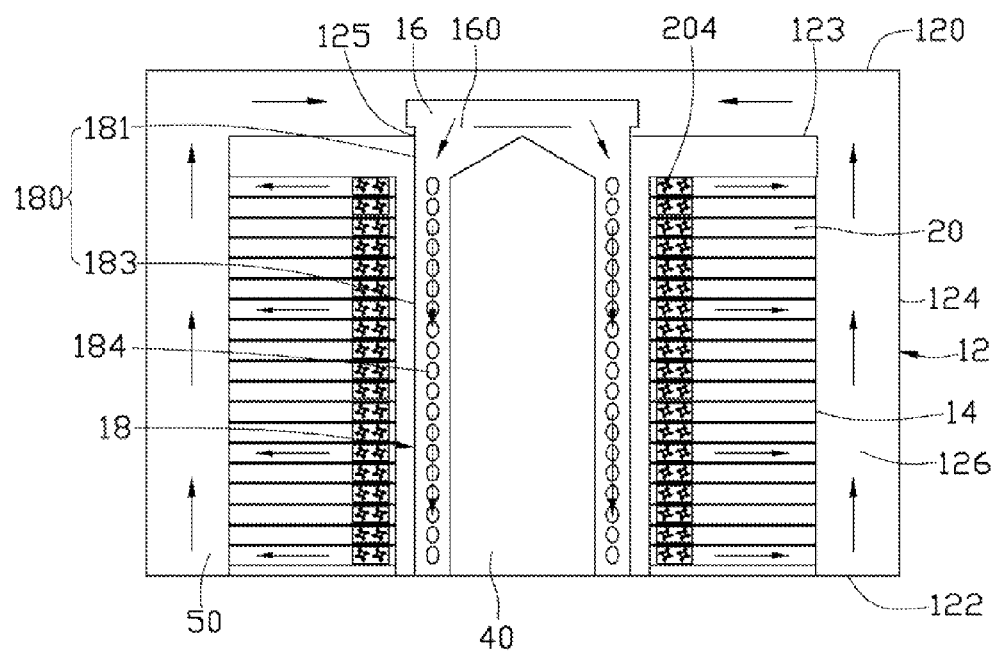
FIG. 2 is a schematic side view of the server system of FIG. 1, wherein a side plate of the server cabinet of the server system is omitted.

Also referring to FIG. 2, the server cabinet 12 includes a top plate 120, a bottom plate 122 under the top plate 120, two side plates 128 respectively interconnecting left and right edges of the top and bottom plates 120 and 122, and two end plates 124 respectively interconnecting front and rear edges of the top and bottom plates 120 and 122. The top plate 120, the bottom plate 122, the end plates 124, and the side plates 128 cooperatively define a space 126 in the server cabinet 12.

The racks 14 are arranged in the space 126 of the server cabinet 12 in a matrix. In this embodiment, the racks 14 are arranged in a matrix of two rows and three columns, as would be viewed from a top of the space 126. One of the rows is at the front of the server cabinet 12, and the other row is at the back of the server cabinet 12. The racks 14 of each row are approximately evenly or evenly distributed between the two side plates 128, and the racks 14 of each column are approximately evenly or evenly distributed between the two end plates 124. A gap 30 is defined between each two neighboring racks 14 of each row of racks 14. A passage 40 is defined between the two rows of racks 14. A channel 50 is defined between each end plate 124 and one corresponding row of racks 14. Alternatively, a size of the server cabinet 12 can be modified to accommodate more racks 14 therein, thereby mounting more servers 20 according to need.

Figure 3:
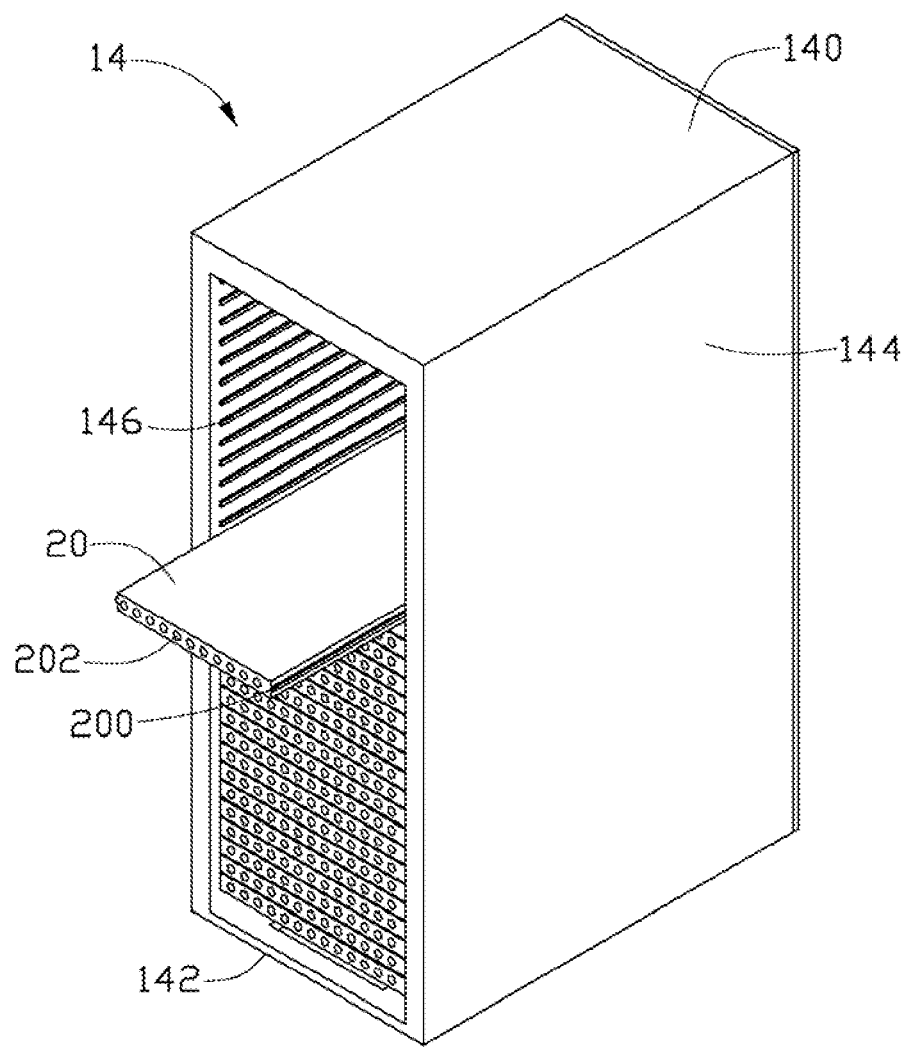
FIG. 3 is a schematic, isometric view of a rack of the server system of FIG. 1 with a number of servers mounted therein.

Referring also to FIG. 3, each rack 14 includes a rectangular top board 140, a bottom board 142 parallel to and spaced from the top board 140, and two sidewalls 144 respectively interconnected between left and right sides of the top board 140 and the bottom board 142. That is, front and rear sides of the rack 14 are open. The racks 14 are mounted in the server cabinet 12, with the sidewalls 144 parallel to the two side plates 128, and the open sides facing the two end plates 124, respectively. A number of sliding rails 146 is formed on inner sides of the sidewalls 144 of each rack 14. The sliding rails 146 are evenly distributed along a vertical axis of the rack 14, for facilitating installation of the servers 20 in the rack 14.

The servers 20 are stacked in each rack 14 along the vertical axis. Each server 20 has two guiding bars 200 respectively formed at left and right sides thereof, matching the sliding rails 146 of the rack 14. When assembled, the guiding bars 200 of the servers 20 slide along the respective sliding rails 146, allowing the servers 20 to slide into the rack 14.

A number of through holes 202 extends through each of the servers 20 from a front side to a rear side, for ventilation. Further, each server 20 has a number of drawing fans 204 arranged in such a manner that air outlets of the drawing fans 204 face the through holes 202, and air inlets of the drawing fans 204 face the passage 40. That is, the drawing fans 204 are oriented towards the passage 40, while ends of the through holes 202 of each server 20 distant from the drawing fans 204 are oriented towards the respective channel 50.

Referring to FIGS. 1 and 2 again, a supporting board 123 covers top sides of the racks 14. In this embodiment, the supporting board 123 is spaced a predetermined distanced from the top sides of the racks 14. An opening 125 is defined at the center of the supporting board 123, aligned with the passage 40. In the present embodiment, the opening 125 is rectangular, a length of the opening 125 is less than a corresponding length of the passage 40, and the opening 125 is aligned over a center of the passage 40.

The heat dissipating device 17 includes an air conditioner 16 for generating cooling air, and air guiding mechanism 18 for guiding the cooling air to the servers 20.

The air conditioner 16 is arranged on the supporting board 123, and coupled to the opening 125 of the supporting board 123. The air conditioner 16 defines two rows of apertures 160 corresponding to the two rows of racks 14. Thus the air conditioner 16 has a total of four apertures 160. The apertures 160 are substantially at the same level as the supporting board 123, and are higher than the top sides of the racks 14. Each row of apertures 160 is located adjacent to the rear of one corresponding row of racks 14. Each of the apertures 160 of each row is aligned with a respective gap 30 of the corresponding row of racks 14.

The guiding mechanism 18 includes a number of tubes 180 adjoining the air conditioner 16 at the apertures 160, respectively. In this embodiment, there are four tubes 180. Each tube 180 includes a main portion 183 and a flared connecting portion 181 expanding up from the main portion 183 to the corresponding aperture 160 of the air conditioner 16. The main portion 183 is supported on the bottom plate 122 of the server cabinet 12. A length (height) of the main portion 183 is substantially equal to a height of each rack 14. Two columns of air outlets 184 are respectively defined at opposite sides of each tube 180. In this embodiment, the air outlets 184 are oriented towards the side plates 128. The air outlets 184 of each column of each tube 180 are evenly distributed in a line parallel to a longitudinal axis of the tube 180. A distance between neighboring air outlets 184 is approximately equal to that between two neighboring servers 20. In this embodiment, there are two tubes 180 arranged in each passage 40. Alternatively, there can be only one tube 180 for each passage 40 when the passage 40 is narrow.

During operation of the servers 20, heat is generated. The drawing fans 204 rotate to evacuate air from the passage 40, and a pressure of the passage 40 is lowered. Cooling air generated by the air conditioner 16 can thus flow down along the tubes 180 and enter the passage 40 via the air outlets 184. The cooling air flows through the drawing fans 204 and the through holes 202 of the servers 20 to exchange heat with the servers 20. The heated air flows out from the servers 20 into the channels 50, and then up along the channels 50 to the air conditioner 16. Finally, the heat carried by the air is dissipated to an exterior of the server system 10 by the air conditioner 16, which thus provides downward cooling air to the servers 20 to continually evacuate the heat thereof.

In summary, the heat dissipating device 17 can evacuate the heat generated by the servers 20, and accordingly the servers 20 can maintain a low working temperature. In addition, the supporting board 123 stops the heated air coming from the channels 50 from crossing to the passage 40 and thence to the servers 20. That is, the supporting board 123 ensures that the heated air coming from the channels 50 reaches the air conditioner 16. Thus, the supporting board 123 further improves the heat dissipation efficiency of the heat dissipating device 17.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server system, comprising:
    a server cabinet;
    a plurality of racks arranged in the server cabinet;
    a plurality of servers mounted in the racks with a passage defined therebetween, each of the servers comprising a drawing fan for drawing air from the passage; and
    a heat dissipating device comprising an air conditioner arranged over the racks for generating cooling air and an air guiding mechanism, the air conditioner defining a plurality of apertures facing the passage, the guiding mechanism comprising a plurality of tubes received in the passage and respectively coupled to the apertures of the air conditioner, each of the tubes defining a plurality of air outlets for directing the cooling air toward at least one of the racks;
    wherein each tube comprises a main portion extending upwardly from a bottom of the sever cabinet and a connecting portion extending upwardly from a top of the main portion to the corresponding aperture, the main portion is located between adjacent racks, a bore diameter of the connecting portion is larger than that of the main portion, the cooling air generated from the air conditioner flows downwardly from the connecting portion to the main portion.

2. The server system of claim 1, wherein a height of the main portion of the tube is approximately equal to that of the rack.

3. The server system of claim 2, wherein the air outlets are formed within the main portion of the tube.

4. The server system of claim 3, wherein the air outlets of each tube comprises two columns of air outlets at opposite sides of the tube, each column of air outlets being evenly distributed along a longitudinal axis of the tube.

5. The server system of claim 4, wherein the racks are arranged in two rows, each row having a plurality of racks with a gap defined between neighboring racks, the passage is defined between the two rows of racks, and each tube is aligned with one gap.

6. The server system of claim 5, wherein a channel is defined between each row of the racks and the server cabinet for flowing up of heated air after the cooling air passes the servers.

7. The server system of claim 5, wherein each rack comprises a top board, a bottom board, and two sidewalls respectively interconnected between left and right sides of the top board and the bottom board, a number of sliding rails being formed on the sidewalls for facilitating installation of the servers.

8. The server system of claim 7, wherein a plurality of through holes extend through each of the servers from a rear side through a front side, and the drawing fans are arranged in such a manner that air outlets of the drawing fans face the through holes while air inlets of the drawing fans face the passage.

9. The server system of claim 8, wherein the server cabinet includes a top plate, a bottom plate, two end plates respectively interconnecting front and rear edges of the top and bottom plates, and two side plates respectively interconnecting left and right edges of the top and bottom plates, wherein the sidewalls of the racks are parallel to the side plates of the server cabinet, and the air outlets of the tubes face the side plates.

10. The server system of claim 5, wherein each of the apertures is aligned with the gap of the corresponding row of the racks.

11. The server system of claim 1, wherein the bore diameter of the connecting portion generally decreases from a top end connecting the corresponding aperture to a bottom end connecting the main portion.

12. A server system, comprising:
    a server cabinet comprising two side plates parallel to each other;
    two rows of racks arranged in the server cabinet, wherein the racks of each row are approximately evenly distributed between the side plates, and a passage is defined between the two rows of racks;
    a plurality of servers mounted on the racks; and
    a heat dissipating device comprising an air conditioner arranged over the racks for generating cooling air and an air guiding mechanism, the air conditioner defining a plurality of apertures facing the passage, the guiding mechanism comprising a plurality of tubes received in the passage and respectively coupled to the apertures of the air conditioner, each of the tubes defining a plurality of air outlets for guiding the cooling air towards the corresponding servers;
    wherein each tube comprises a main portion extending upwardly from a bottom of the sever cabinet and a connecting portion extending upwardly from a top of the main portion to the corresponding aperture, the main portion is located between adjacent racks, a bore diameter of the connecting portion is larger than that of the main portion, the cooling air generated from the air conditioner flows downwardly from the connecting portion to the main portion.

13. The server system of claim 12, wherein the air outlets of the tubes are oriented towards the side plates.

14. The server system of claim 12, wherein a height of the main portion of the tube is approximately equal to that of the rack, and the air outlets are formed within the main portion of the tube.

15. The server system of claim 12, wherein each of the servers comprises a drawing fan disposed with an air inlet thereof facing the passage and air outlet thereof facing the server.

16. The server system of claim 15, wherein each of the servers defines a plurality of through holes facing the air outlet of the drawing fan.

17. The server system of claim 16, wherein the through holes extend through the servers along an axis parallel to the side plates.

18. The server system of claim 12, wherein the bore diameter of the connecting portion generally decreases from a top end connecting the corresponding aperture to a bottom end connecting the main portion.

* * * * *